United States Patent
Ortman et al.

(10) Patent No.: US 6,611,152 B1
(45) Date of Patent: Aug. 26, 2003

(54) TEST ADAPTER FOR CONFIGURING THE ELECTRICAL COMMUNICATION BETWEEN A UNIT UNDER TEST AND AN ELECTRONIC TEST STATION AND ASSOCIATED SEPARATOR PLATE

(75) Inventors: Stephen Bernard Ortman, Shoreline, WA (US); Amador Miguel Amor, Shoreline, WA (US); Lam Tung Dinh, Lynnwood, WA (US)

(73) Assignee: The Boeing Company, Seattle, WA (US)

( * ) Notice: Subject to any disclaimer, the term of this patent is extended or adjusted under 35 U.S.C. 154(b) by 39 days.

(21) Appl. No.: 09/702,529

(22) Filed: Oct. 31, 2000

(51) Int. Cl.[7] .............................................. G01R 31/02
(52) U.S. Cl. .................................. 324/754; 324/158.1
(58) Field of Search ............................. 324/73.1, 158.1, 324/761, 754, 755, 762, 765; 439/482

(56) References Cited

U.S. PATENT DOCUMENTS

| | | | |
|---|---|---|---|
| 4,354,268 A | * | 10/1982 | Michel et al. .............. 324/73.1 |
| 4,870,347 A | * | 9/1989 | Cicerone .................. 324/158.1 |
| 4,922,191 A | | 5/1990 | Conover |
| 5,091,826 A | | 2/1992 | Arnett et al. |
| 5,103,378 A | | 4/1992 | Stowers et al. |
| 5,493,230 A | * | 2/1996 | Swart et al. ................ 324/761 |
| 5,793,218 A | | 8/1998 | Oster et al. |
| 5,953,214 A | * | 9/1999 | Dranchak et al. ........... 257/686 |
| 5,955,888 A | * | 9/1999 | Frederickson et al. ...... 324/754 |
| 6,281,692 B1 | * | 8/2001 | Bodenweber et al. ....... 324/755 |

\* cited by examiner

Primary Examiner—Vinh P. Nguyen
(74) Attorney, Agent, or Firm—Alston & Bird LLP

(57) ABSTRACT

A test adapter is provided that configures the electrical communication between a unit under test (UUT) and an electronic test station, particularly existing, commonly used test stations. The test adapter consists of a printed wiring board having at least one electrically conductive path and at least one connection terminal in electrical communication with the conductive path, whereby the connection terminal connects the UUT to the adapter. Additionally, the test adapter includes a plurality of electrically conductive pins that are in electrical communication with the electrically conductive path and extend outward from a first surface of the printed wiring board, wherein the pins are adapted to electrically connect the test adapter to the test station. To space the printed wiring board from the electronic test station so as to eliminate mechanical interference between them, the test adapter also includes an insulative separator plate situated adjacent to the first surface of the printed wiring board, wherein at least a portion of the separator plate includes a plurality of apertures through which the pins extend.

25 Claims, 5 Drawing Sheets

TEST ADAPTER FOR CONFIGURING THE ELECTRICAL COMMUNICATION BETWEEN A UNIT UNDER TEST AND AN ELECTRONIC TEST STATION AND ASSOCIATED SEPARATOR PLATE

FIELD OF THE INVENTION

The present invention relates generally to an electronic test station for testing electronic devices and, more particularly, to test adapters for configuring the electrical communication between a unit under test and an electronic test station.

BACKGROUND OF THE INVENTION

Complex electronic systems are commonly employed in an increasing number of applications, such as onboard commercial and military aircraft. These complex electronic systems are typically comprised of a number of smaller electronic units that are electronically connected. The configuration of these units creates an overall system that can be tested and maintained by looking at the system on a unit by unit basis. Thus, the entire electronic system need not be scrapped due to the failure of a component or a unit. Instead the unit that has failed can be individually identified and replaced.

As such, industries using complex electronic systems often employ test stations with test adapters to test these units, typically referred to as units under test (UUTs). For example, one commonly used test station, the ATS-182a model automated test station, is designed to test various UUTs in the avionics industry. Test stations generally provide a UUT with a number of electrical signals and measure the corresponding responses. Based upon these responses, the test station can troubleshoot the UUT. In order to communicate with the UUT, a test station typically includes an interface panel that is connected to the UUT by means of a test adapter. For example, the ATS-182a test station has a patchpanel interface provided by AMP Incorporated that employs leaf spring paddles for receiving respective pins of the test adapter. In this regard, after the UUT is connected to the test adapter, the test adapter is connected to the ATS-182a test station by securing the test adapter to a holding frame that aligns the pins with the leaf spring paddles. By actuating a lever arm, the pins are forced against the leaf spring paddles.

While one test station can be used to test various UUTs, the varying nature of these UUTs oftentimes requires test adapters to be customized for the UUTs to ensure that a specific type of UUT can communicate with the test station. Typically, test adapters are customized by technicians who hand wire the test adapters to permit as many as 1,768 unique connections between the test station and adapter alone. Hand wiring each adapter can be very labor intensive, error prone and costly to implement. Facing this problem, a number of alternative test adapters have been developed. For example, U.S. Pat. No. 4,922,191 issued May 1, 1990 to Conover (hereinafter "the '191 patent") discloses an interconnection assembly for connecting a UUT to a test station, including a testing unit and an interface test adapter unit having signal relaying circuitry for electronically interfacing between the testing unit and a UUT. While test adapters such as that of the '191 patent eliminate the need for hand wiring each adapter, they require uniquely designed test stations, and are generally not compatible with existing, commonly used test stations.

Another type of test adapter design, disclosed in U.S. Pat. No. 5,793,218 issued Aug. 11, 1998 to Oster et al. (hereinafter "the '218 patent"), includes an interface frame and an interchangeable circuit card assembly configured to route signals between the test station and UUT. The '218 patent further discloses the test adapter connected to the test station either by means of a ribbon cable assembly, a connector block with wires connecting to contact pins, or a connector strip on the adapter itself. While the design of the '218 patent also reduces the need for hand wiring each adapter, the interface between the adapter and test station presents additional drawbacks. The connection means between the adapter and test station does not lend itself to easy adoption into current, commonly used test stations. Additionally, connecting the test adapter to the test station by means of a ribbon cable assembly or connector block with wires adds complexity to the test adapter design and makes operation of the test adapter more cumbersome.

SUMMARY OF THE INVENTION

In view of the foregoing background, the present invention therefore provides an improved test adapter and an associated separator plate for configuring the electrical communication between a UUT and an electronic test station, particularly existing, commonly used test stations, without requiring that the test adapter be hand wired. The test adapter of the present invention comprises a printed wiring board having two major opposed surfaces, and consisting of at least one electrically conductive path and at least one connection terminal in electrical communication with the electrically conductive path, whereby the connection terminal connects the UUT to the adapter. In one embodiment, the printed wiring board further includes at least one electrical protection network in electrical communication with the electrically conductive path. The test adapter of the present invention also,includes a plurality of electrically conductive pins that are in electrical communication with the conductive path and extend outward from a first surface of the printed wiring board, wherein the pins are adapted to electrically connect the test adapter to the test station. To space the printed wiring board from the electronic test station so as to eliminate mechanical interference between them, the test adapter of the present invention also includes a separator plate, made from an insulative material such as an epoxy glass, situated adjacent to the first surface of the printed wiring board, wherein at least a portion of the separator plate includes a plurality of apertures through which the pins extend.

In one embodiment, the test adapter further includes an insulative connecting member having two major opposed surfaces and at least one connector adapted to attach the connecting member to the test station. At least a portion of the connecting member further includes a plurality of openings such that when the connecting member is secured to the separator plate, the pins extend through the openings. Additionally, the connecting member can include a frame that extends peripherally about the connecting member, including that portion of the connecting member that defines the openings, and that includes the connector.

In another embodiment, the test adapter further includes an enclosure mounted to the printed wiring board such that the electrically conductive path of the printed wiring board is within the enclosure. The enclosure can also be mounted to the printed wiring board such that the terminal of the printed wiring board is outside the cavity. In one embodiment, the test adapter includes further at least one daughter printed wiring board having at least one electrically conductive path that is mounted to a side wall of the enclosure and is connected to the printed wiring board such that the electrically conductive path of the daughter printed wiring board and the electrically conductive path of the printed wiring board are in electrical communication.

According to one aspect of the present invention, the separator plate includes first and second opposing surfaces. In this embodiment, the second surface of the separator plate includes a frame extending peripherally thereabout and outward therefrom such that the frame defines a recessed medial portion of the second surface. Also in this embodiment, the separator plate has a plurality of apertures, typically situated in a rectangular array, opening through the recessed medial portion of the second surface for providing access for the pins extending between the test adapter and the test station.

In one embodiment, at least a portion of the printed wiring board includes a plurality of contacts in electrical communication with the electrically conductive path. In this embodiment, the test adapter further includes a plurality of electrically conductive sockets disposed in mechanical and electrical communication with respective ones of the contacts such that the sockets and the electrically conductive path are in electrical communication. The pins are then disposed at least partially within the sockets and extend outward therefrom such that the pins and the sockets are in electrical communication.

Each pin preferably has first and second opposing segments. The first segment has a diameter smaller than the openings in the connecting member, but the second segment has a diameter larger than the openings. Due to this diameter difference between the first and second segments, when the second segment is disposed within the sockets and the connecting member is secured to the separator plate, the first segment, but not the second segment, will extend through the connecting member.

The test adapter of the present invention therefore offers an improved test adapter for configuring the electrical communication between a UUT and an electronic test station, particularly existing, commonly used test stations. By employing a printed wiring board, the test adapter eliminates the need for hard wiring the test adapter for use with varying UUTs. Also, the pin arrangement on the test adapter provides a compatible interface with existing, commonly used test stations. Moreover, the pin and separator plate arrangement makes the test adapter design capable of being directly interfaced with the test station without requiring added wire or ribbon cable assemblies that can add complexity to the test station and test adapter arrangement.

BRIEF DESCRIPTION OF THE DRAWINGS

Figure 1:
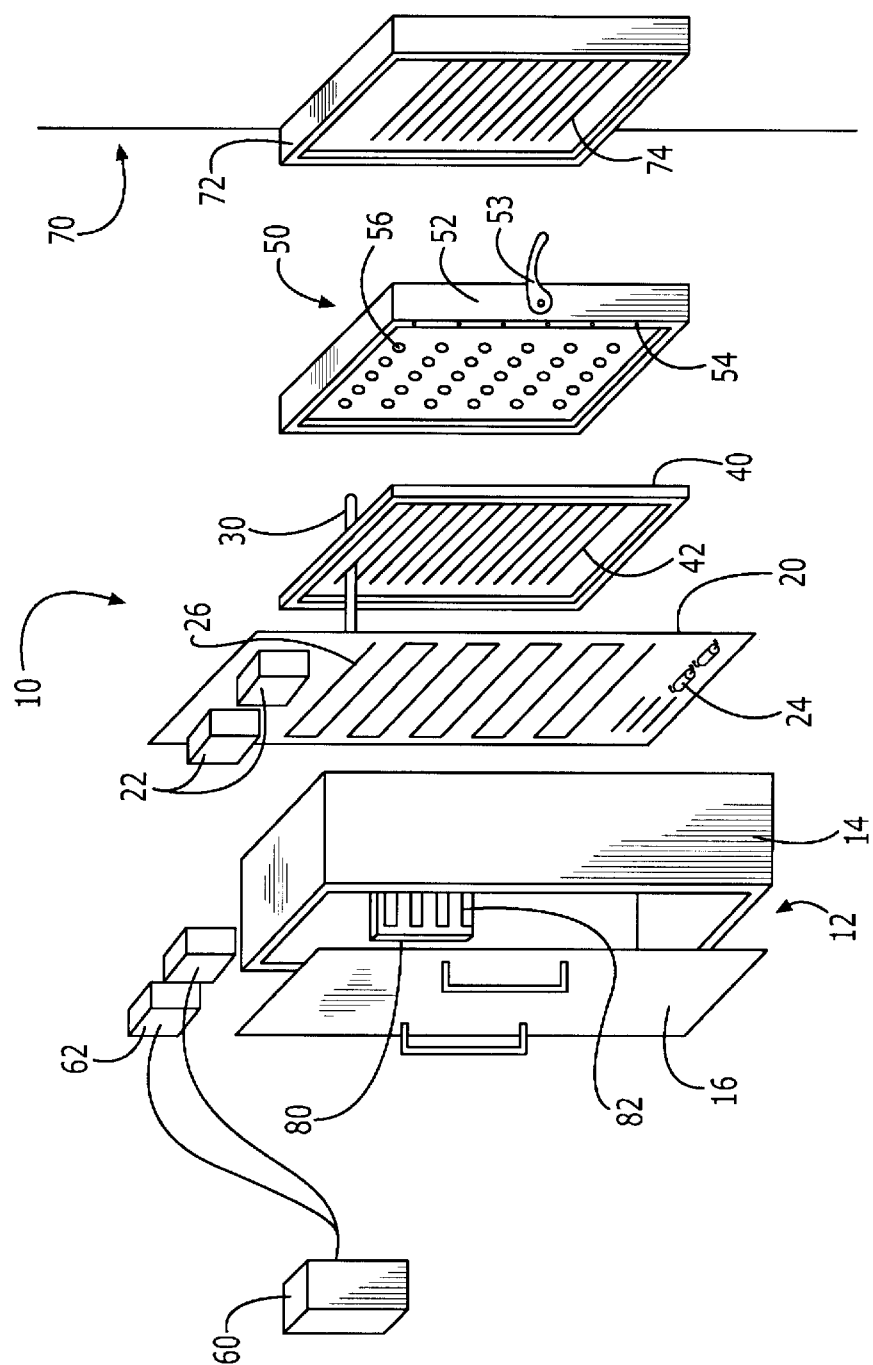
Figure 3:
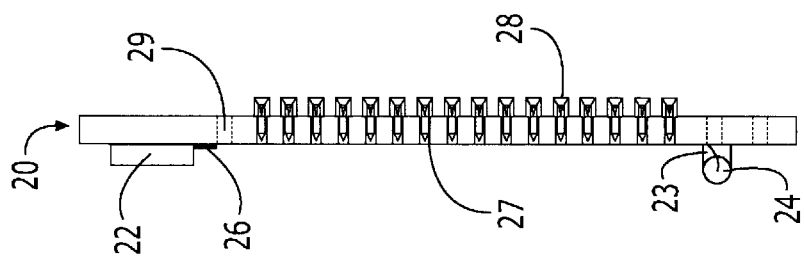
Figure 2:
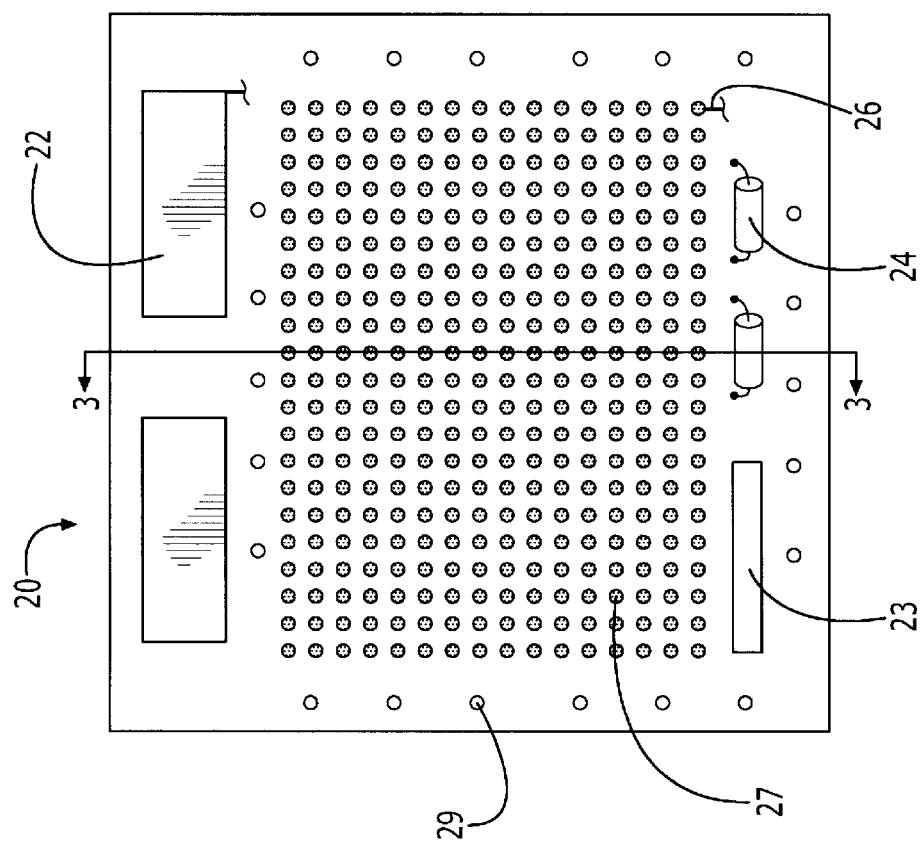
Figure 5:
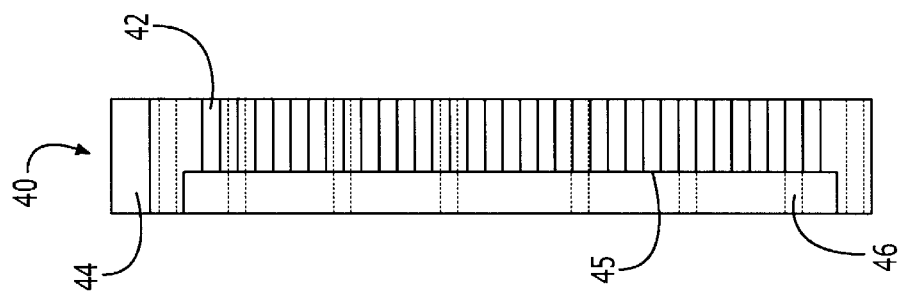
Figure 4:
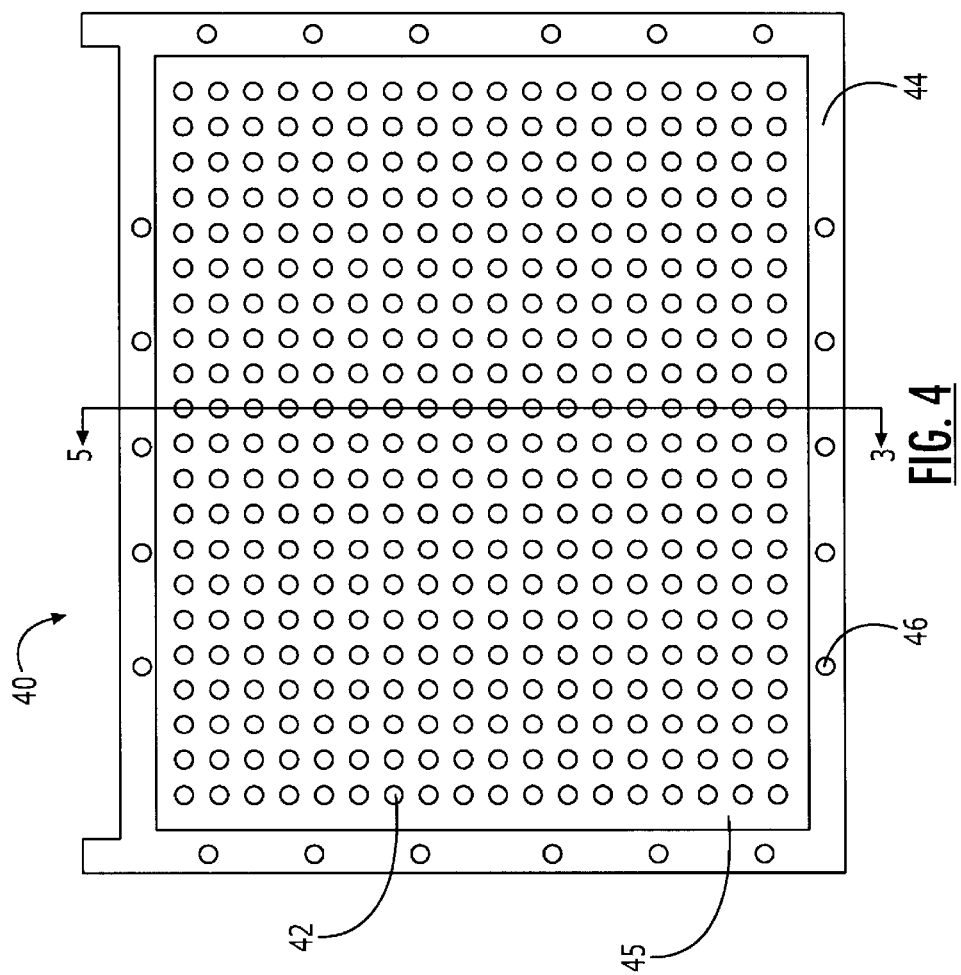
Figure 6:
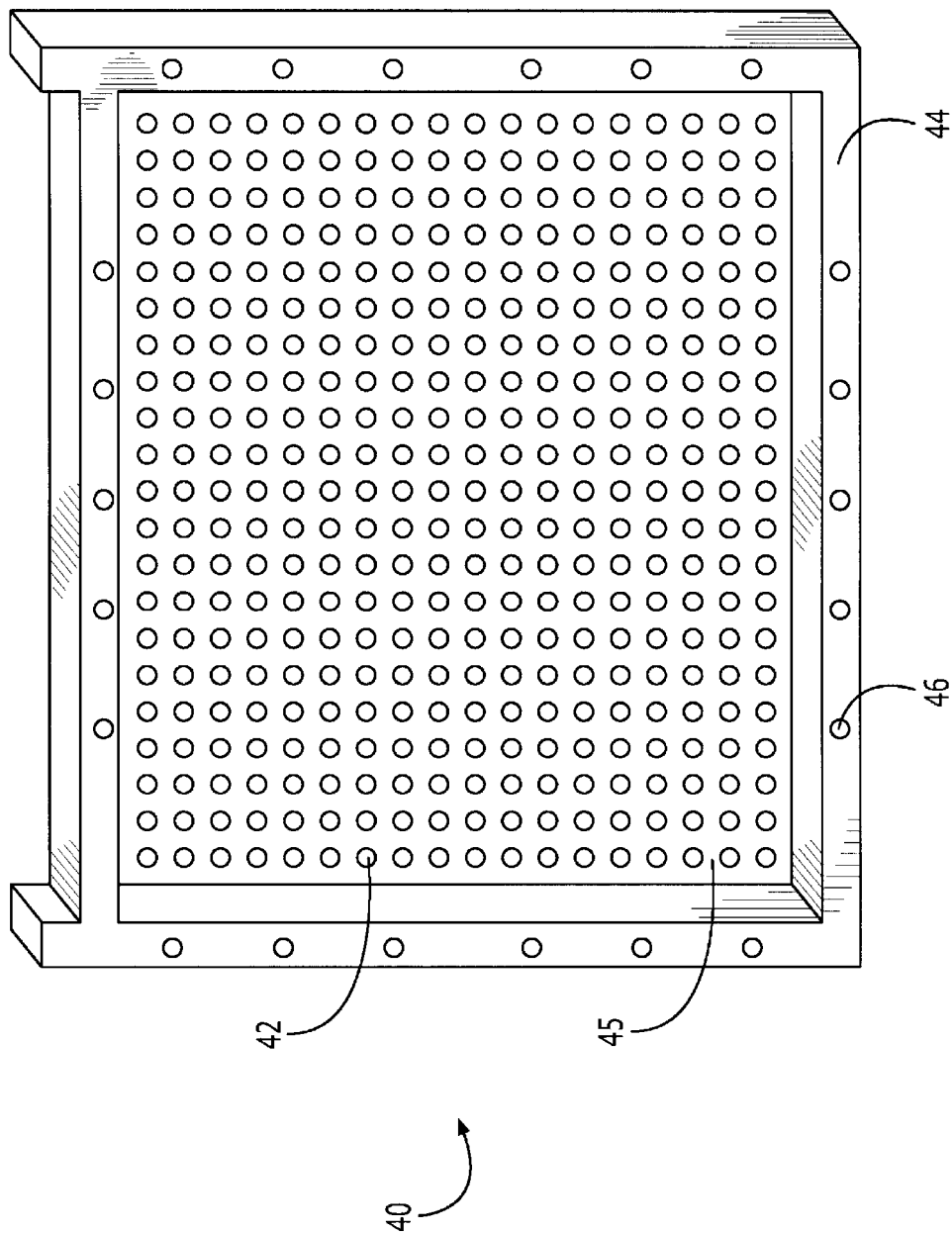
Figure 8:
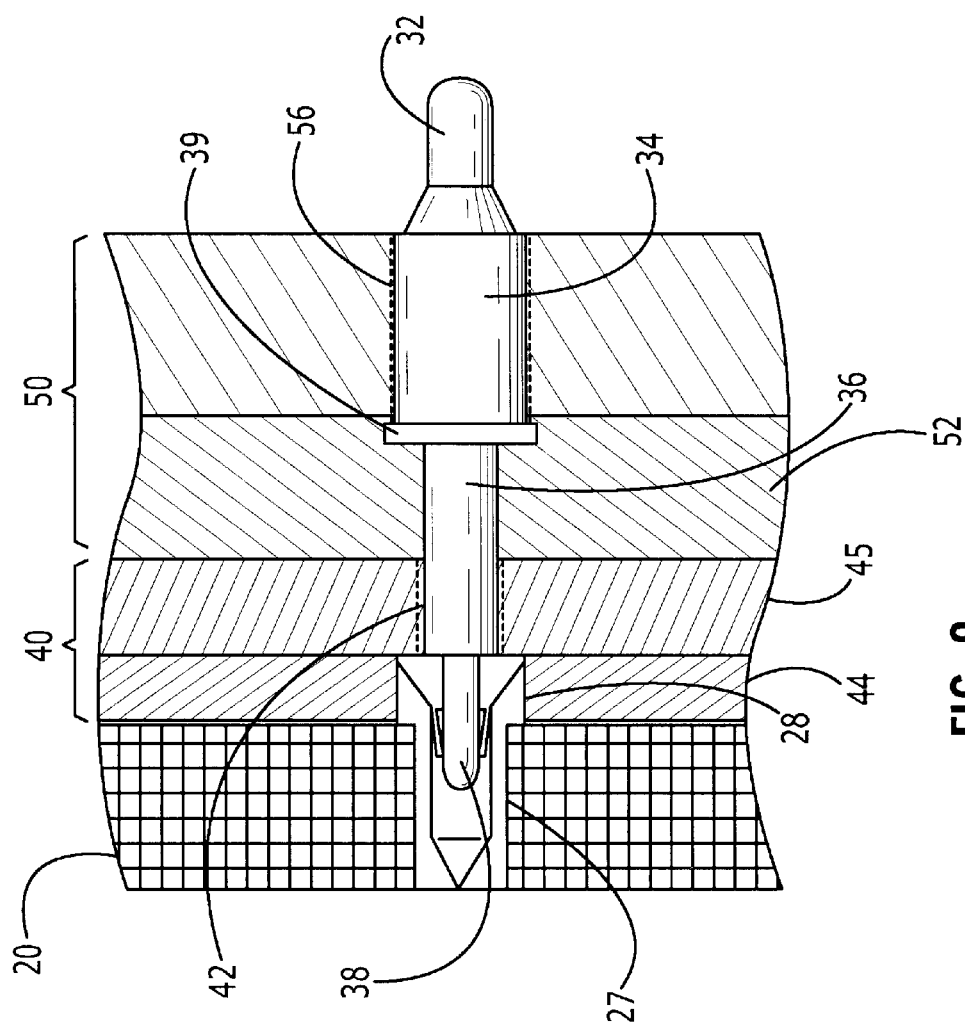
Figure 7:
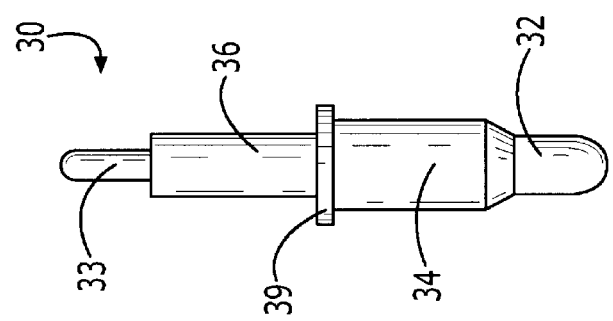

Having thus described the invention in general terms, reference will now be made to the accompanying drawings, which are not necessarily drawn to scale, and wherein:

FIG. 1 is an exploded, orthographic illustration of the test adapter of the present invention, FIG. 2 is a front view of the printed wiring board according to one embodiment of the present invention;

FIG. 3 is a cross sectional view of one embodiment of the printed wiring board taken along line 3—3 of FIG. 2;

FIG. 4 is a front view of the insulative separator plate according to one embodiment of the present invention;

FIG. 5 is a cross sectional view of one embodiment of the insulative separator plate taken along line 5—5 of FIG. 4;

FIG. 6 is an orthographic illustration of one embodiment of the insulative separator plate;

FIG. 7 is a front view of one embodiment of the electrically conductive pin; and FIG. 8 is a cross sectional view of the electrically conductive pin illustrated in FIG. 7 disposed within the test adapter according to one embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring now to FIG. 1, a test adapter 10 is provided that configures the electrical communication between a UUT 60 and an electronic test station 70. For example, in the avionics industry the test adapter can be used in connection with an electronics test station, such as the ATS-182a model automated test station, to test a variety of avionics units such as those manufactured by The Boeing Company, the assignee of the present invention. For example, the UUTs are line replaceable units (LRUs), such as electronic boxes or cards, but the UUTs can be other electronic units, if so desired. The test adapter includes a printed wiring board 20, a plurality of electronically conductive pins 30 and an insulative separate plate 40, each of which are more fully described below.

Referring to FIGS. 1 through 3, the printed wiring board 20 can be formed from an insulative material, such as an epoxy glass, and oftentimes has a multilayer construction as known to those skilled in the art. The printed wiring board includes at least one and, more typically, a pair of connection terminals 22 for electrically connecting the test adapter 10 to the UUT 60, such as by means of a cable assembly 62 or the like. The printed wiring board also includes at least one electrically conductive path 26 in electrical communication, albeit directly or indirectly, with the connection terminal. As also known to those skilled in the art, the printed wiring board typically includes a plurality of electrically conductive paths for interconnecting various electronic components in order to appropriately route and process the signals. In this regard, the printed wiring board can also include a plurality of electrical components 24 interconnected by the electrically conductive paths for implementing the various test functions on the UUT. The electrical components can include resistors, capacitors, inductors, integrated circuits and the like that are electrically connected to respective electrically conductive paths for providing appropriate test signals to the UUT and for properly processing the signals received in response. The components included on the printed wiring board therefore allow the test adapter to be customized for the specific UUT being tested by the test station 70. Moreover, the printed wiring board can also include an electrical protection network 23, such as fuses, relays and the like, for protecting the test adapter, the UUT and/or the test station.

The electrically conductive paths are also in electrical communication with the pins 30 that extend outward from the printed wiring board 20. Although the test adapter typically includes a plurality of pins, the test adapter of FIG. 1 depicts a single pin for purposes of illustration. The pins are electrically connected to a respective electrically conductive path such that the pins are also in electrical communication with a connection terminal 22. In one embodiment, illustrated in FIG. 3, the printed wiring board includes a plurality of contacts 27, such as plated through holes, into which a plurality of electrically conductive sockets 28, such as leaf spring sockets, are disposed. The sockets can be connected to respective contacts by soldering or the like. The pins can then engage respective sockets both mechanically and electrically. For example, each socket can include a segment that snugly fits within a respective hole and a receptacle for receiving one end of a pin.

Referring now to FIGS. 1, 4, 5 and 6, the test adapter 10 includes a separator plate 40 for reducing mechanical interference between the test adapter, particularly the printed wiring board 20, and the test station 70. The separator plate is made from an insulative material, such as an epoxy glass, and defines a plurality of apertures 42, typically arranged in a rectangular array corresponding to the plurality of contacts 74 of the test station 70. In one embodiment, as illustrated in FIGS. 4, 5 and 6, the separator plate has a peripheral frame 44. Also, the medial portion of the plate 45 is recessed such that the sockets 28 can extend beyond the surface of the printed wiring board and the peripheral frame of the separator plate can be secured directly to the printed wiring board 20 when the separator plate and the printed wiring board 20 are connected. The printed wiring board and the separator plate are typically connected by means of fasteners, such as bolts or screws, that extend through corresponding holes 29, 46 defined by the printed wiring board and the separator plate. Importantly, the printed wiring board and the separator plate are connected in an aligned relationship such that the electrically conductive pins extend through the apertures in the separator plate.

Referring to FIG. 1, one embodiment of the test adapter 10 includes a connecting member 50 to connect the test adapter to the test station 70 and, more particularly, to the frame 72 that surrounds the electrical interface 74 of the test station. The connecting member is made from an insulative material, generally an epoxy glass and, in one embodiment, includes a frame 52 extending peripherally thereabout. The connecting member includes at least one connector 53 for connecting to the frame 72 of the test station 70. The connector is generally disposed along on the side facing the test station and on an exterior side of the frame. For use with a test station such as the ATS-182a, the connector(s) would typically comprise a pair of projections which engage corresponding latching structures on the frame of the test station. The engagement of the projections by the latching structures secures the test adapter to the frame of the ATS-182a test station and keeps the pins in alignment with respective contacts or terminals of the test station until the test adapter is moved upwardly, such as by actuation of the lever arm of the frame, which wedges the pins into contact with corresponding leaf spring paddles. The details of the mechanical interconnections between a test adapter and the interface of a test station are conventional and are known to those of skill in the art.

At least a portion of the connecting member, such as a medial portion, defines a plurality of openings 56 for receiving corresponding pins 30. As such, when the connecting member is secured to the separator plate 40, the pins 30 extend through the openings far enough to engage respective contacts 74 of the test station 70. The connecting member also includes at least and, more commonly, several holes 54 disposed in alignment with holes 29, 46 of the printed wiring board and the separator plate for receiving corresponding fasteners for securing the printed wiring board 20, the separator plate and the connecting member together.

To protect the printed wiring board 20, one embodiment of the test adapter 10 includes an enclosure 12, formed from a conductive material, such as aluminum. The enclosure has an open end and an opposed closed end and, in one embodiment, the closed end comprises a removable cover 16, as illustrated. To connect the enclosure to the printed wiring board, the enclosure includes at least one and, more typically, a plurality of holes that are aligned with corresponding holes 29, 46, 54 of the printed wiring board, separator plate and connector for receiving respective fasteners. The holes defined by the enclosure are not illustrated in FIG. 1 due to the orthographic angle of the enclosure, but the fastener would generally be disposed adjacent the side of the enclosure facing the printed wiring board. As illustrated, the enclosure is typically attached to the printed wiring board such that the electrically conductive path, the various electrical components 24 and the electrical protection network 23 reside inside the enclosure, while the connection terminal 22 remains outside the enclosure. In this respect, the UUT 60 can be attached and removed from the test adapter without removing or opening the enclosure. However, the electrically conductive path, electrical protection network and the connection terminal can all be protected within the enclosure.

In one embodiment, the test adapter 10 further includes a daughter printed wiring board 80 that adds functionality to the printed wiring board by further modifying the signals transmitted by the printed wiring board 20 between the UUT and the test station 70. The daughter printed wiring board has at least one electrically conductive path 82 and can include a plurality of electrical components as described above in conjunction with the printed wiring board for appropriately processing the signals. Moreover, the daughter printed wiring board and, in particular, the electrically conductive path carried by the daughter printed wiring board is electrically connected to an electrically conductive path 26 on the printed wiring board 20.

As described, the test adapter includes a plurality of pins 30 for connecting respective contacts of the printed wiring board and the test station. Referring to FIGS. 7 and 8, the pin 30 is comprised of an electrically conductive material and, in one embodiment, is comprised of a multi-layer metal composition, such as gold plated nickel. In one embodiment, the pin consists of multiple segments with different diameters to engage the printed wiring board 20 as described below. A first segment 38 of the electrically conductive pin is adapted to fit inside a socket 28 that is disposed within the printed wiring board 20, as shown in FIGS. 3 and 8. When the separator plate 40 is attached to the printed wiring board, a second segment 36 of the electrically conductive pin resides at least partially within the aperture 42 of the separator plate, while a third segment 34, an annular segment 39 and a fourth segment 32 are disposed on the opposite side of the separator plate from the printed wiring board. Importantly, the diameter of the annular segment is larger than the openings 56 in the connecting member 50, while the diameter of the third and forth segments have a diameter smaller than the openings. When the connecting member is attached to the separator plate, the diameter difference allows the third segment to at least partially reside within the openings in the connecting member and the forth segment to extend through the opening, with the annular segment being incapable of extending therethrough, thereby holding the pin in place when it is inserted or removed from the openings 74 in the test station 70. Also, when the connecting member is attached to the separator plate, the fourth segment of the pin extends through the openings in the connecting member such that the fourth segment is capable of engaging a respective opening 74 in the test station 70.

The test adapter 10 of the present invention therefore offers an improved test adapter for configuring the electrical communication between a UUT 60 and an electronic test station 70, particularly existing, commonly used test stations. The test adapter eliminates the need for hard wiring the test adapter for use with varying UUTs and is capable of being directly interfaced with the test station without requiring added wire or ribbon cable assemblies that can add complexity to the test station and test adapter arrangement.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A test adapter for configuring the electrical communication between a unit under test and an electronic test station, said test adapter comprising:
   a printed wiring board having two major opposed surfaces, said printed wiring board comprising at least one electrically conductive path and at least one connection terminal in electrical communication therewith, wherein the at least one connection terminal is adapted to be electrically connected to the unit under test;
   a plurality of electrically conductive pins retained by said printed wiring board and extending outward from a first surface of said printed wiring board, wherein said pins and the at least one electrically conductive path of said printed wiring board are in electrical communication, and wherein said pins are adapted to be electrically connected to the electronic test station; and
   an insulative separator plate disposed adjacent to the first surface of said printed wiring board, wherein at least a portion of said separator plate defines a plurality of apertures through which said pins extend, and wherein said separator plate is adapted to space said printed wiring board from the electronic test station so as to eliminate mechanical interference between the electronic test station and said printed wiring board.

2. A test adapter according to claim 1 wherein said separator plate comprises:
   a first surface; and
   a second surface opposing said first surface, wherein said second surface comprises a frame extending peripherally thereabout and outward therefrom such that the frame defines a recessed medial portion of said second surface, and
   wherein said separator plate defines a plurality of apertures opening through the recessed medial portion of said second surface for providing access between the test adapter and the electronic test station.

3. A test adapter according to claim 2 wherein said separator plate defines a plurality of apertures arranged in a rectangular array.

4. A test adapter for configuring the electrical communication between a unit under test and an electronic test station, said test adapter comprising:
   a printed wiring board having two major opposed surfaces, said printed wiring board comprising at least one electrically conductive path and at least one connection terminal in electrical communication therewith, wherein the at least one connection terminal is adapted to be electrically connected to the unit under test;
   a plurality of electrically conductive pins extending outward from a first surface of said printed wiring board, wherein said pins and the at least one electrically conductive path of said printed wiring board are in electrical communication, and wherein said pins are adapted to be electrically connected to the electronic test station;
   an insulative separator plate disposed adjacent to the first surface of said printed wiring board, wherein at least a portion of said separator plate defines a plurality of apertures through which said pins extend, and wherein said separator plate is adapted to space said printed wiring board from the electronic test station so as to eliminate mechanical interference between the electronic test station and said printed wiring board; and
   a connecting member formed of an insulative material and having two major opposed surfaces and at least one connector adapted to secure said connecting member to the test station, wherein at least a portion of said connecting member defines a plurality of openings, and wherein at least a portion of said connecting member is secured to said separator plate such that said pins extend through the openings.

5. A test adapter according to claim 4 wherein said connecting member further comprises a frame extending peripherally thereabout, and wherein the at least one connector is attached to the frame.

6. A test adapter according to claim 4 wherein at least a portion of said printed wiring board defines a plurality of holes, wherein each pin further comprises first and second opposing segments, wherein the first segment has a diameter smaller than the opening defined by said connecting member and the second segment has a diameter larger than the openings, wherein at least a portion of second segment is disposed within the holes such that said pins and the at least one electrically conductive path of said printed wiring board are in electrical communication, and wherein when said connecting member is secured to said separator plate the first segment will extend through said connecting member with the second segment incapable of extending therethrough.

7. A test adapter for configuring the electrical communication between a unit under test and an electronic test station, said test adapter comprising:
   a printed wiring board having two major opposed surfaces, said printed wiring board comprising at least one electrically conductive path and at least one connection terminal in electrical communication therewith, wherein the at least one connection terminal is adapted to be electrically connected to the unit under test;
   a plurality of electrically conductive pins extending outward from a first surface of said printed wiring board, wherein said pins and the at least one electrically conductive path of said printed wiring board are in electrical communication, and wherein said pins are adapted to be electrically connected to the electronic test station;
   an insulative separator plate disposed adjacent to the first surface of said printed wiring board, wherein at least a portion of said separator plate defines a plurality of apertures through which said pins extend, and wherein said separator plate is adapted to space said printed wiring board from the electronic test station so as to eliminate mechanical interference between the electronic test station and said printed wiring board; and an enclosure having a closed end and an opposed open end and side walls extending therebetween, wherein said enclosure is mounted to said printed wiring board such that the at least one electrically conductive path is disposed within said enclosure.

8. A test adapter according to claim 7 further comprising at least one daughter printed wiring board having at least one electrically conductive path mounted to the side walls of said enclosure, wherein the at least one electrically conductive path of said at least one daughter printed wiring board and the at least one electrically conductive path of said printed wiring board are in electrical communication.

9. A test adapter according to claim 7 wherein said enclosure is mounted to said printed wiring board such that the at least one terminal is outside the cavity.

10. A test adapter according to claim 7 wherein the closed end of said enclosure comprises a cover that is removably secured to the side walls.

11. A test adapter for configuring the electrical communication between a unit under test and an electronic test station, said test adapter comprising:

a printed wiring board having two major opposed surfaces, said printed wiring board comprising at least one electrically conductive path and at least one connection terminal in electrical communication therewith, wherein the at least one connection terminal is adapted to be electrically connected to the unit under test, and wherein said printed wiring board further comprises at least one electrical protection network in electrical communication with the at least one electrically conductive path;

a plurality of electrically conductive pins extending outward from a first surface of said printed wiring board, wherein said pins and the at least one electrically conductive path of said printed wiring board are in electrical communication, and wherein said pins are adapted to be electrically connected to the electronic test station; and an insulative separator plate disposed adjacent to the first surface of said printed wiring board, wherein at least a portion of said separator plate defines a plurality of apertures through which said pins extend, and wherein said separator plate is adapted to space said printed wiring board from the electronic test station so as to eliminate mechanical interference between the electronic test station and said printed wiring board.

12. A test adapter for configuring the electrical communication between a unit under test and an electronic test station, said test adapter comprising:

a printed wiring board having two major opposed surfaces, said printed wiring board comprising at least one electrically conductive path and at least one connection terminal in electrical communication therewith, wherein the at least one connection terminal is adapted to be electrically connected to the unit under test;

a plurality of electrically conductive pins retained by said printed wiring board and extending outward from a first surface of said printed wiring board, wherein said pins and the at least one electrically conductive path of said printed wiring board are in electrical communication, and wherein said pins are adapted to be electrically connected to the electronic test station; and an insulative separator plate disposed adjacent to the first surface of said printed wiring board, wherein at least a portion of said separator plate defines a plurality of apertures through which said pins extend, and wherein said separator plate is adapted to space said printed wiring board from the electronic test station so as to eliminate mechanical interference between the electronic test station and said printed wiring board, and wherein said separator plate is formed of an epoxy glass material.

13. A test adapter for configuring the electrical communication between a unit under test and an electronic test station, said test adapter comprising:

a printed wiring board having two major opposed surfaces, said printed wiring board comprising at least one electrically conductive path and at least one connection terminal, wherein at least a portion of a first surface of said printed wiring board comprises a plurality of contacts in electrical communication with the at least one conductive path, wherein the at least one connection terminal and the at least one electrically conductive path of said printed wiring board are in electrical communication, and wherein the at least one connection terminal is adapted to be electrically connected to the unit under test;

a plurality of electrically conductive sockets disposed in mechanical and electrical communication with respective ones of said contacts such that said sockets and the at least one electrically conductive path of said printed wiring board are in electrical communication; and a plurality of electrically conductive pins disposed at least partially within said sockets and extending outward therefrom, wherein said pins and said sockets are in electrical communication, and wherein said pins are adapted to be directly connected to the electronic test station and in electrical communication therewith.

14. A test adapter according to claim 13 further comprising an insulative separator plate disposed adjacent to the first surface of said printed wiring board, wherein at least a portion of said separator plate defines a plurality of apertures through which said pins extend, wherein said separator plate is adapted to space said printed wiring board from the electronic test station so as to eliminate mechanical interference between the electronic test station and said printed wiring board.

15. A test adapter according to claim 14 wherein said separator plate comprises:

a first surface; and a second surface opposing said first surface, wherein said second surface comprises a frame extending peripherally thereabout and outward therefrom such that the frame defines a recessed medial portion of said second surface, and wherein said separator plate defines a plurality of apertures opening through the recessed medial portion of said second surface for providing access between the test adapter and the electronic test station.

16. A test adapter according to claim 14 wherein said separator plate is formed of an epoxy glass material.

17. A test adapter according to claim 14 wherein said separator plate defines a plurality of apertures arranged in a rectangular array.

18. A test adapter according to claim 14 further comprising a connecting member formed of an insulative material and having two major opposed surfaces and at least one connector adapted to secure said connecting member to the test station, wherein at least a portion of said connecting member defines a plurality of openings, and wherein at least a portion of said connecting member is secured to said separator plate such that said pins extend through the openings.

19. A test adapter according to claim 18 wherein each pin further comprises first and second opposing segments, wherein the first segment has a diameter smaller than the openings defined by said connecting member and the second segment has a diameter larger than the openings, wherein at least a portion of second segment is disposed within said sockets such that when said connecting member is secured to said separator plate the first segment will extend through said connecting member with the second segment incapable of extending therethrough.

20. A test adapter according to claim 18 wherein said connecting member further comprises a frame extending peripherally thereabout, and wherein the at least one connector is attached to the frame.

21. A test adapter according to claim 20 further comprising an enclosure having a closed end and an opposed open end and side walls extending therebetween, wherein said enclosure is mounted to said printed wiring board such that the at least one electrically conductive path is disposed within said enclosure.

22. A test adapter according to claim 21 further comprising at least one daughter printed wiring board having at least one electrically conductive path, mounted to the side walls of said enclosure, wherein the at least one electrically conductive path of said at least one daughter printed wiring board and the at least one electrically conductive path of said printed wiring board are in electrical communication.

23. A test adapter according to claim 21 wherein said enclosure is mounted to said printed wiring board such that the at least one terminal is outside the cavity.

24. A test adapter according to claim 21 wherein the closed end of said enclosure comprises a cover that is removably secured to the side walls.

25. A test adapter according to claim 13 wherein said printed wiring board further comprises at least one electrical protection network in electrical communication with the at least one electrically conductive path.

* * * * *